United States Patent [19]

Brown

[11] 4,323,730
[45] Apr. 6, 1982

[54] IDLE CHANNEL NOISE SUPPRESSOR FOR SPEECH ENCODERS

[75] Inventor: Anthony K. D. Brown, Kanata, Canada

[73] Assignee: Northern Telecom Limited, Montreal, Canada

[21] Appl. No.: 48,144

[22] Filed: Jun. 13, 1979

[51] Int. Cl.³ .................. H03K 13/01; H03K 13/20
[52] U.S. Cl. .................................. 179/1 P; 370/4; 375/5
[58] Field of Search .......... 179/15 AE, 15 BY, 15 A, 179/1 VC, 15 AS, 18 BC; 340/347 M, 347 AD, 347 DA, 347 C; 370/80, 81; 375/34

[56] References Cited

U.S. PATENT DOCUMENTS

| | | |
|---|---|---|
| 3,508,007 | 4/1970 | Goodall et al. ............ 179/18 BC X |
| 3,712,959 | 1/1973 | Fariello ............................ 179/1 VC |
| 3,838,416 | 9/1974 | Brown .......................... 340/347 DA |
| 3,890,467 | 6/1975 | Sciulli .......................... 179/15 AS X |
| 4,027,102 | 5/1977 | Ando et al. ...................... 179/1 VC |
| 4,061,878 | 12/1977 | Adoul et al. ................ 179/1 VC X |
| 4,142,066 | 2/1979 | Ahamed ................................. 375/28 |

Primary Examiner—Thomas J. Sloyan
Attorney, Agent, or Firm—Frank P. Turpin

[57] ABSTRACT

The idle channel for a speech encoder is detected by the detection, at the encoder comparator output, of zero-level traversals caused by noise transient signals appearing at the analog input of the encoder. In response to the detection of an idle channel, the encoder is caused to output a PCM code sample corresponding to a zero amplitude analog signal. In order that a speech signal passing through zero amplitude during the sampling period not be confused with an idle channel condition, the detection circuit responds only to a plurality of zero-level traversals.

4 Claims, 1 Drawing Figure

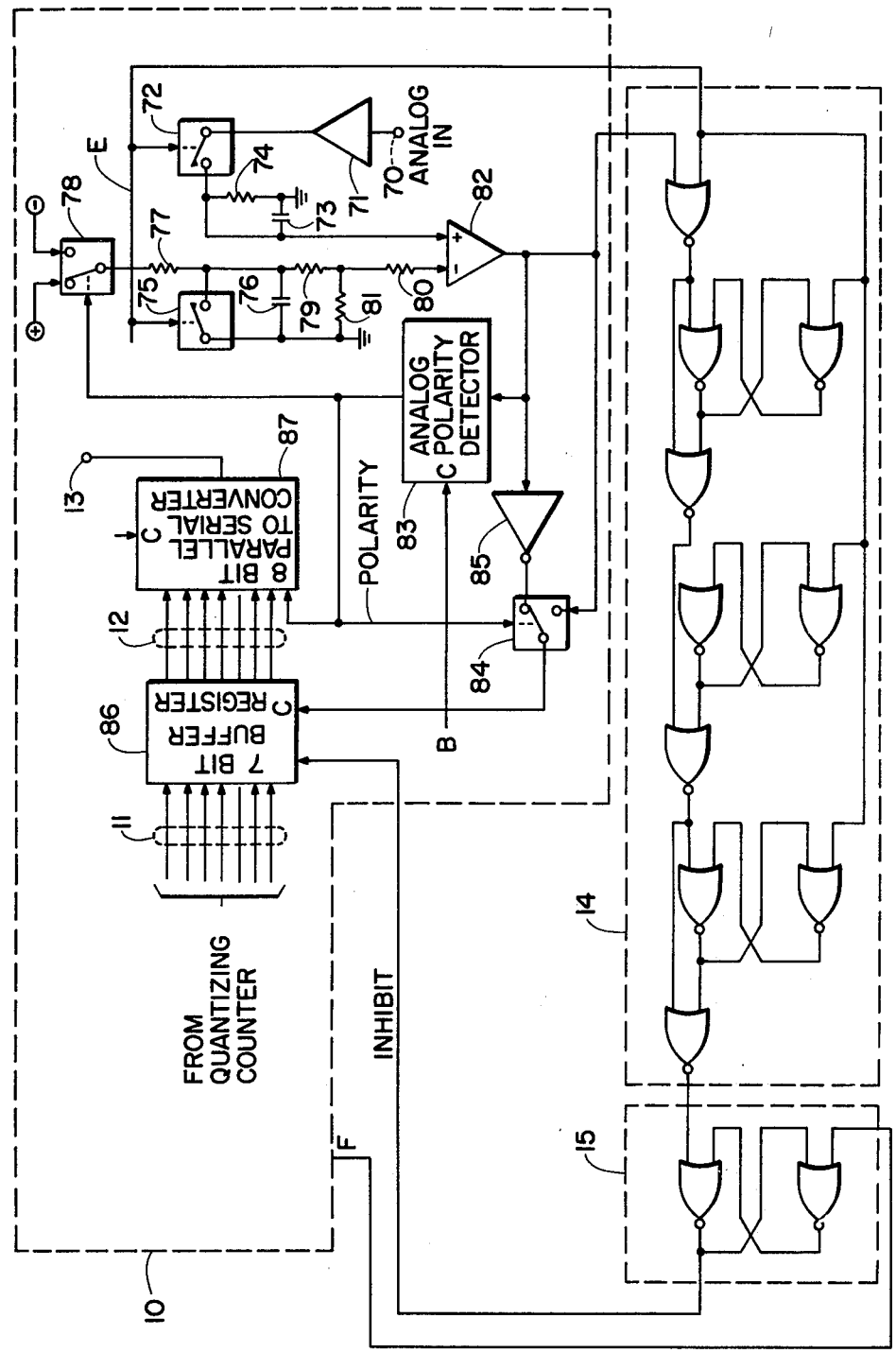

IDLE CHANNEL NOISE SUPPRESSOR FOR SPEECH ENCODERS

The invention relates to analog-to-digital voice encoders in general and more particularly to a circuit and method for suppressing idle channel noise therein.

The transmission of voice information using pulse code modulation (PCM) techniques is now well established in the art. The general history and theory of such systems is discussed at length in "Principles of Pulse-code Modulation" by K. W. Cattermole, Iliffe Books Limited, London, 1969. An analog-to-digital and digital-to-analog converter for use in such systems is described in U.S. Pat. No. 3,838,416, issued Sept. 24, 1974, to A. K. D. Brown, and assigned to the instant assignee. The voice encoder described in that patent employs an analog comparator to compare the amplitude of an analog speech sample with a reference voltage having predetermined characteristics. The operation of the comparator is such that, under normal speech conditions during the sampling period, the output of the comparator is either high or low depending on the relative amplitudes of the speech sample and the reference voltage. This is used to determine the sign of the analog sample, the reference voltage being zero during the sampling period. The comparator compares the amplitude of the reference voltage with the stored value of that sample at the end of the sampling period. Since encoders do not distinguish between speech and idle circuit conditions, noise transients or spikes occuring during idle circuit conditions are encoded just like speech samples. For example, a noise spike occuring on an idle channel just at the end of the sampling period would be encoded as the analog value of the spike. In addition, the value of the noise encoded is frequently the peak noise amplitude which can be much greater than the RMS noise value.

The invention solves this problem by providing a circuit and method for suppressing idle channel noise.

In a voice encoder, the comparator reference voltage is at the zero-level during the speech sampling. In the event of an idle channel, the effect of random transient noise impulses is to cause the comparator output signal to oscillate in a random fashion. These oscillations can in turn be used to detect an idle channel since they only occur when the comparator inputs are very nearly equal, that is, the analog sample is effectively zero. Therefore, in accordance with the invention, there is provided a means for detecting an idle channel condition by detecting the oscillations at the comparator output and effect suppression of the noise by causing the encoding circuit to output a pulse code modulation sample corresponding to a zero-level analog signal amplitude. In order that a speech signal passing through zero amplitude during the sampling period not be confused with an idle channel condition, it is necessary that the detection circuit responds only to a minimum sequence of two zero-level traversals.

An example embodiment of the invention will now be described with reference to the attached drawing which is a schematic diagram of a voice encoding circuit including a circuit for suppressing idle channel noise in accordance with the invention.

The attached diagram shows a codec which is similar to the one described in the above-identified patent. Since circuits for providing pulse code modulation encoding of voice signals are generally well-known, the diagram is limited to the circuitry necessary to realize the invention. Within the portion 10 of the codec, the identifying numerals correspond to those of FIG. 1 in the above-identified patent. There is shown a buffer register 86 which receives a seven-bit word from a quantizing counter (not shown) via a bus 11. The output from the register 86 is fed to a parallel-to-serial converter 87 via a bus 12 and the PCM sample is made available at an output terminal 13. Also shown is a comparator 82 connected to a source of reference voltage and to a source of analog signal to be encoded. These circuits may be better described by explaining their operation.

The voice signal to be encoded is connected from analog input 70 through a voice frequency amplifier 71 to a sampling gate 72. The sampling gate 72 is closed during the latter half of each frame by the sampling control signal E for an interval of about 20 microseconds at an 8 KHz rate. When the signal E is applied to the gate 72, a capacitor 73 is charged up to the analog signal level. Upon removal of the sampling control signal E, the capacitor 73 commences to discharge exponentially through a shunt resistor 74. Coincident with the above sequence, a control gate 75 is closed by the sampling control signal E thereby discharging a capacitor 76 to ground. Upon opening of the gate 75, the capacitor 76 commences to charge exponentially through a resistor 77 from either a positive or negative source of potential which is controlled by a polarity gate 78 as hereinafter explained. The exponentially rising voltage across the capacitor 76 is then coupled through a resistive pad comprising series resistors 79 and 80 and a shunt resistor 81 to the negative input of a differential comparator 82 which also has its positive input connected across the capacitor 73. The comparator 82 switches at the point where its input terminals reverse polarity. During the preceding sampling interval the comparator 82 output is fed to an analog polarity detector 83 which reads the analog polarity at the output of comparator 82 when a reset pulse B occurs (at the end of the sampling interval). The output polarity signal from the polarity detector 83 in turn controls the polarity gate 78 and also provides the outgoing digital polarity information on the eighth bit. The polarity signal is also used to control an output control gate 84 which is fed from an inverted signal passing through an inverter amplifier 85 or a non-inverted signal fed directly from the differential comparator 82. The output control signal from the gate 84 is used to trnasfer the 7-bit digital count of the quantizing counter from a buffer register 86 to the input of an 8-bit parallel-to-serial converter 87. This digital count corresponds to the time elapsed for the exponential decay of the analog sample to the reference potential.

The 7-bit PCM word from the buffer register 86 is combined with the analog polarity information to form an 8-bit PCM word in the converter 87. This 8-bit parallel word is then serially fed out from the converter 87 at the required time.

The output of the comparator 82 is also connected to an idle channel detection and noise suppressor circuit comprising a three-stage counter circuit 14 connected to a flip-flop 15 whose output is connected to the buffer register 86. The reset input of the flip-flop 15 is connected to a source of signal F which provides a reset signal just prior to the sampling period. A second input to the counter circuit 14 is connected to the control signal E which enables the counter during the sampling period. The inhibit signal from flip-flop 15 prevents the register 86 from loading the 7-bit word from the quantizing counter, thereby causing all "1"s to be registered instead. Of course, the inhibit mechanism may take many different forms depending on the type of logic gates used to realize the register 86. Basically, all that is required is that the register 86 be caused to register all "1" bits at the time that it receives the control signal for reading the content of the quantizing counter. This code corresponds to the international standard (CCITT) for a zero amplitude analog sample.

Operation

At the beginning of the sampling period, the flip-flop 15 is reset and the counter circuit 14 is enabled. During the sampling period which has a duration of approximately twenty microseconds, the reference voltage at the input of the comparator 82 is at the zero-level. For the purpose of this description, it is assumed that terminal 70 is connected to an idle channel, that is, a channel on which a voice signal is not present. Under these conditions, the noise signals which appear at terminal 70 will cause the output of the comparator 82 to assume alternate and repetitive "0" and "1" levels. These zero-level traversals appear at the input of the counter circuit 14 which responds thereto by propagating a "0" along its stages until the flip-flop 15 is set. It will be noted that the flip-flop 15 will be set in response to a 1 0 1 0 1 sequence or a 0 1 0 1 0 1 sequence. The detector circuit is designed to respond to more than one traversal so that an idle channel will not be confused with an occupied channel on which the speech signal is passing through the zero amplitude level. At the end of the sampling period, the inhibit signal from the flip-flop 15 prevents the transfer of data from the quantizing counter to the buffer register 86. This causes the buffer register 86 to load a word comprised of all "1"s which corresponds to a zero amplitude PCM code. Hence, when the PCM code samples associated with an idle channel are decoded at a receiver, noise will not be generated on that channel. In an actual embodiment, it was found that, without impairment to speech quality, idle channel noise was reduced, on the average, by twelve decibels. In that instance, the speech sampling period was twenty microseconds at a rate of eight KHz, and the comparator output made at least fourteen zero-level traversals during the sampling period of an idle channel.

The detection circuit described above is adapted to detect an idle channel when three zero-level traversals occur. This is to prevent the detection circuit from responding to the case where a noise spike is superimposed on a true analog sample such as might happen with a dector adapted to detect two zero-level traversals. However, such a detector, would still be considered as operating satisfactorily in many systems.

What is claimed is:

1. In a circuit for encoding analog signals into pulse code modulation samples, the encoding circuit comprising an analog comparator circuit responsive to an analog signal and to a reference signal to provide a first signal, a method for recognizing an idle channel during a sampling period, comprising the steps of: counting at least two, and not more than thirty two, zero-level traversals by the signal at the output of the analog comparator circuit during a single sampling period, and storing in a register means a signal indicating the presence of said traversals whereby the encoding circuit is caused to output a pulse code modulation word corresponding to a zero amplitude analog signal.

2. In a circuit for encoding analog signals into pulse code modulation samples, the encoding circuit comprising an analog comparator circuit responsive to an analog signal and to a reference signal to provide a first signal, and a first circuit means responsive to the first signal for providing a pulse code modulation sample representative of the amplitude of the analog sample, a method for suppressing idle channel noise, comprising the steps of: counting at least two, not more than thirty two, zero level traversals by the signal at the output of the analog comparator circuit during a single sampling period and in response to a predetermined count, causing the first circuit means to output a pulse code modulation word representative of a zero amplitude analog signal.

3. In a circuit for encoding analog signals into pulse code modulation samples, the encoding circuit comprising an analog comparator circuit responsive to an analog signal and to a reference signal for providing a first signal, and a first circuit means, including a buffer register, responsive to the first signal for generating and storing in said buffer register a pulse code modulation sample representative of the amplitude of the analog sample, a circuit for suppressing idle channel noise, comprising:

a detector register circuit;

a counter circuit responsive to at least two, and not more than thirty two, zero-level traversals by the signal at the output of the analog comparator circuit during a single sampling period for storing in the detector register circuit a signal indicating the presence of said traversals, the output of said detector register circuit providing an inhibit signal for causing said buffer register to store a pulse code modulation sample representative of a zero amplitude analog signal.

4. A circuit as defined in claim 3 wherein the counter circuit is a three-stage counter.

* * * * *